United States Patent [19]

Fox et al.

[11] Patent Number: 4,776,022

[45] Date of Patent: Oct. 4, 1988

[54] SYSTEM FOR PRINTED CIRCUIT BOARD DEFECT DETECTION

[75] Inventors: David G. Fox, Bedford; John R. Mann, III, Boston, both of Mass.

[73] Assignee: AOI Systems, Inc.

[21] Appl. No.: 721,477

[22] Filed: Apr. 9, 1985

[51] Int. Cl.⁴ .............................................. G06K 9/00
[52] U.S. Cl. ...................................... 382/8; 356/237; 358/106
[58] Field of Search .......................... 382/8; 356/237; 364/489; 358/106

[56] References Cited

U.S. PATENT DOCUMENTS

| | | | |
|---|---|---|---|
| 4,170,003 | 10/1979 | Danielsson et al. | 340/146 |
| 4,223,387 | 9/1980 | Danielsson et al. | 364/515 |
| 4,392,120 | 7/1983 | Mita et al. | 382/22 |
| 4,481,664 | 11/1984 | Linger et al. | 382/8 |
| 4,500,202 | 2/1985 | Smyth | 356/237 |
| 4,547,895 | 10/1985 | Mita et al. | 382/8 |
| 4,578,810 | 3/1986 | MacFarlane et al. | 382/8 |

OTHER PUBLICATIONS

Antonsson et al., "A System for Automatic Visual Inspection of Printed Circuit Boards" Internskrift, Linköping University, Lith-Isy-I-0264 (Jan. 16, 1979) pp. 1-22.

Danielsson et al, "Distance Checking Algorithms", Internskrift, Linköping University, Lith-ISY-I--0175,(9/21/1977), pp. 1-61.

"Optical Pattern Recognition", *Proceedings of the Society of Photo-Optical Instrumentation Engineers*, vol. 201, Aug. 29-30, 1979, San Diego, Calif., Wm. A. Bentley (The Inspectron: An Automatic Optical Printed Circuit Board (PCB) Inspector).

"An Automatic Optical Printed Circuit Inspection System", Restrick, Robert, SPIE, vol. 116 Solid State Imaging Devices (1977).

"Distance Checking Algorithms", 9/21/77, by Erik Danielsson and Bjorn Kruse, Linkoping University, Sweden Department of Electrical Engineering.

"Automated Optical Inspection of Multilayer Printed Circuit Boards", Wm. A. Bentley, 102/SPIE, vol. 220, Optics in Metrology and Quality Assurance (1980).

*Primary Examiner*—Leo H. Boudreau
*Attorney, Agent, or Firm*—Robert M. Asher

[57] ABSTRACT

An apparatus for automatic printed wiring board (PWB) defect detection comprises an array of optical sensors for optically inspecting a printed wire circuit. The array forms a binary image pattern of the PWB which is tested for compliance with logical rules of correctly printed PWB's regarding unterminated conductors; a set of minimum and maximum specified line widths; line spacing width; presence of insulators on conductors and vice versa; presence of pinholes, flecks of copper, and Vees and neck-downs.

A method employs an inner enable pattern of pixel bits formed to determine if a feature being viewed is possibly on a conductor line or insulator space. A set of same-state patterns is formed around the center of the matrix with each pattern being progressively larger. The state of opposite pixel points on the same-state patterns is progressively examined to determine the first inner pattern in which opposite pixel points are ot in the same state. Measurement and verification patterns are selected based upon which same-state pattern meets the above test. The measurement pattern is used to determine if the feature is centered in the matrix and the dimensions of the measurement pattern are checked against stored dimensions of acceptable size. The verification pattern is used to ascertain feature characteristics by counting the number of opposite verification pattern pixels, both on conductor, both on insulator and in opposite states and the number of transitions.

18 Claims, 14 Drawing Sheets

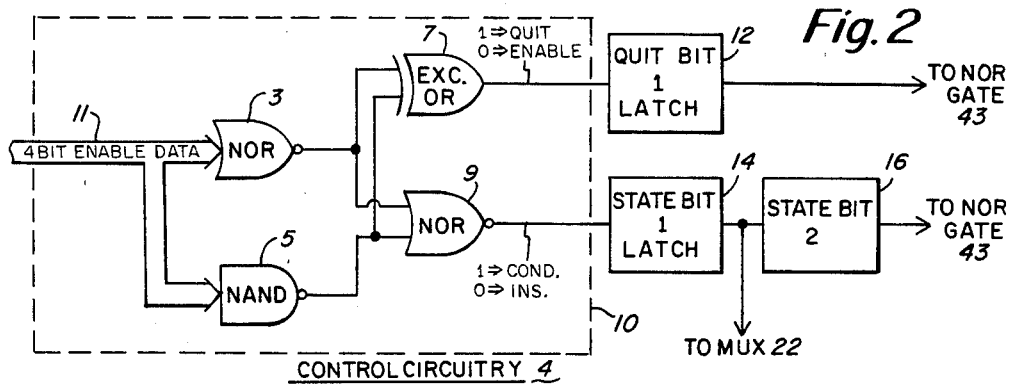
Fig. 2
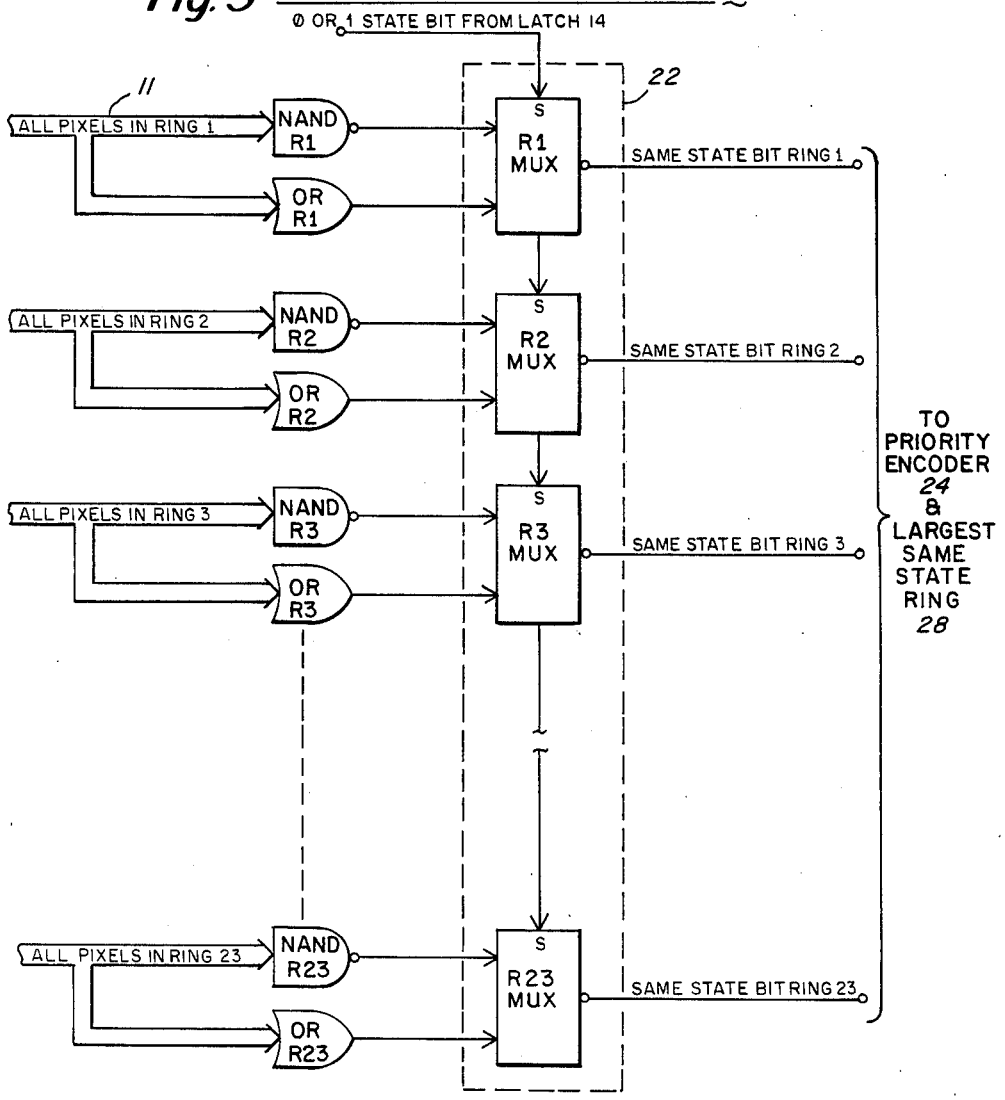
Fig. 3 SAME STATE DETERMINATION CIRCUIT 6

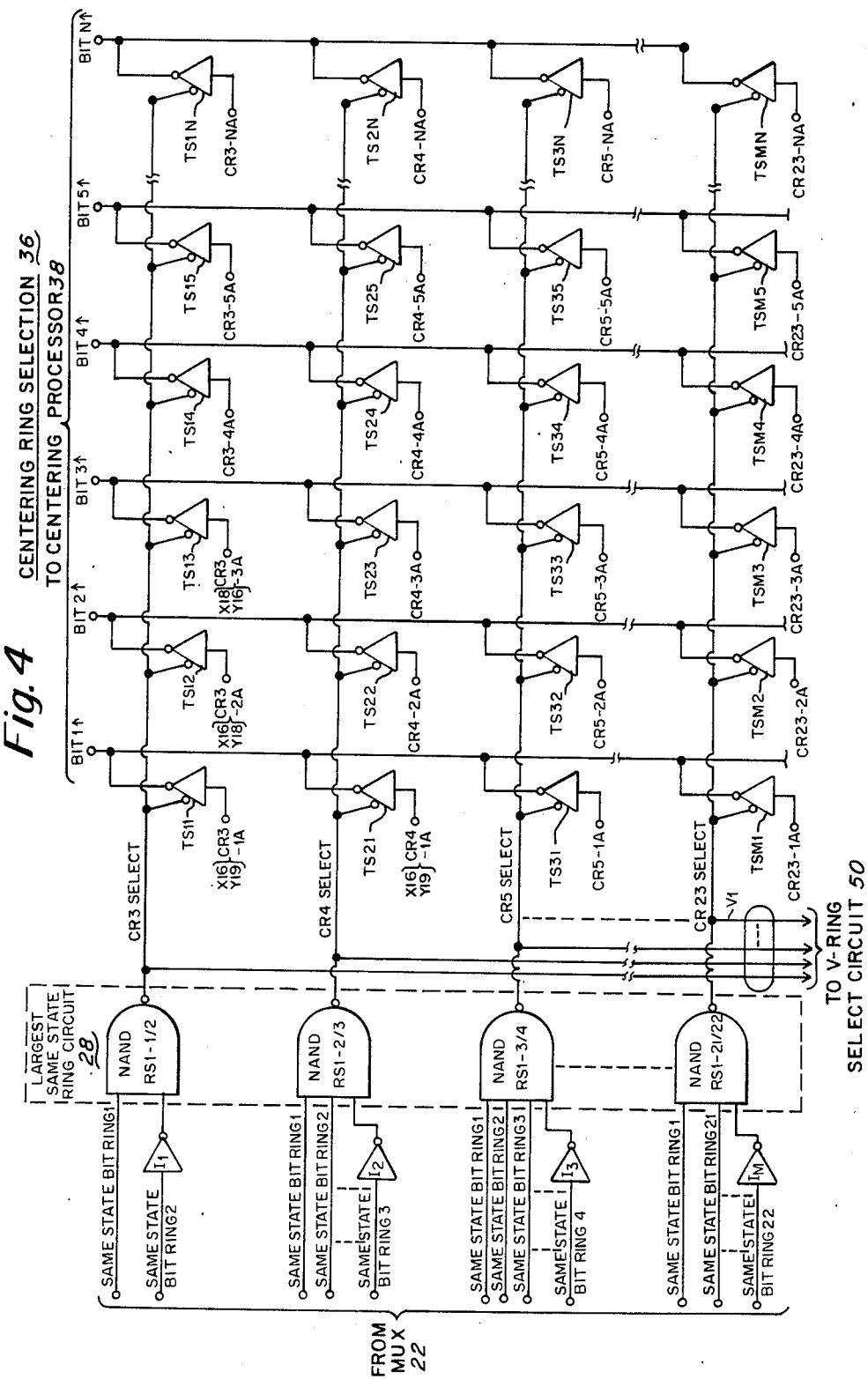

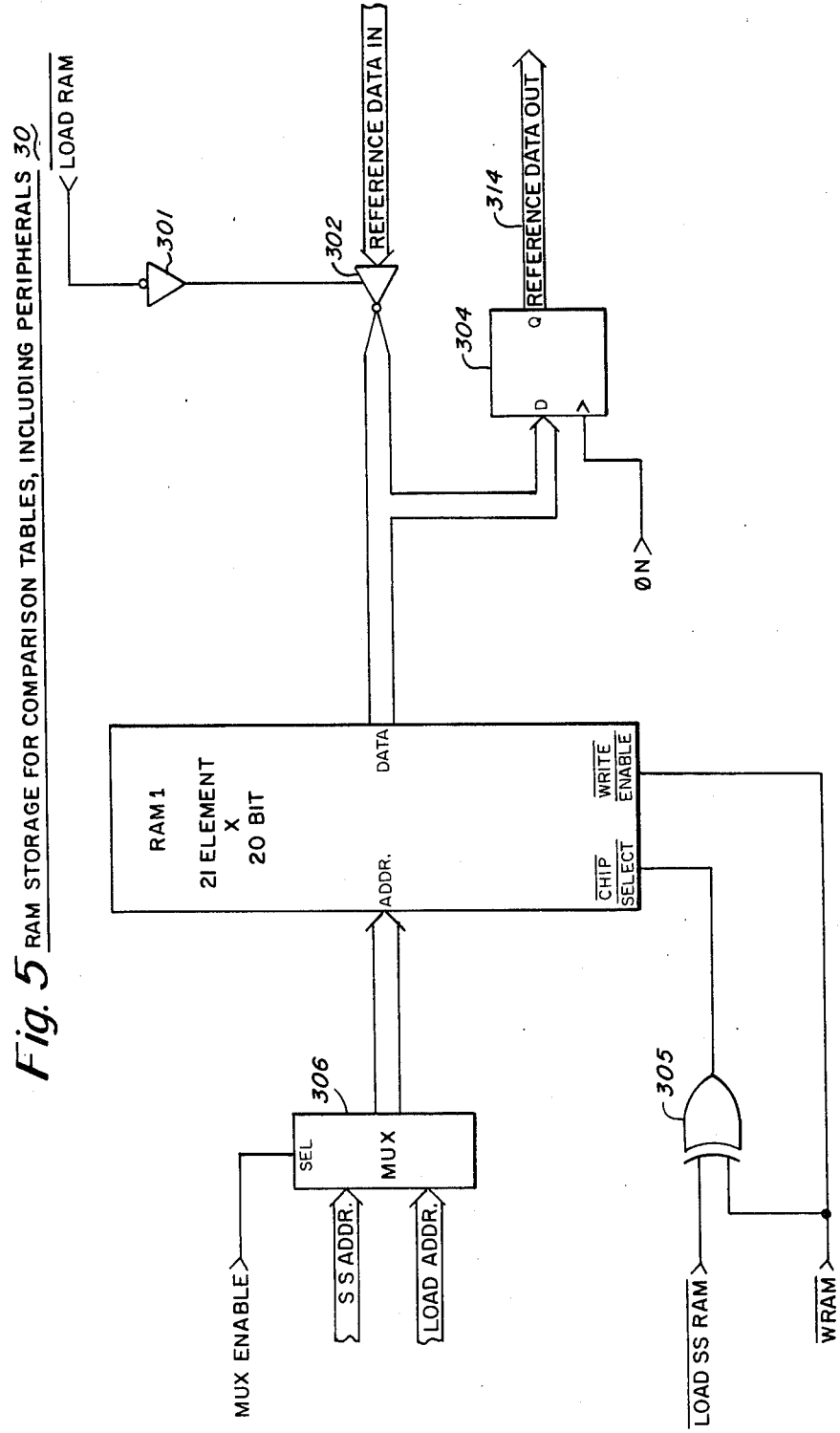
Fig. 5 RAM STORAGE FOR COMPARISON TABLES, INCLUDING PERIPHERALS 30

CENTERING PROCESSOR 38

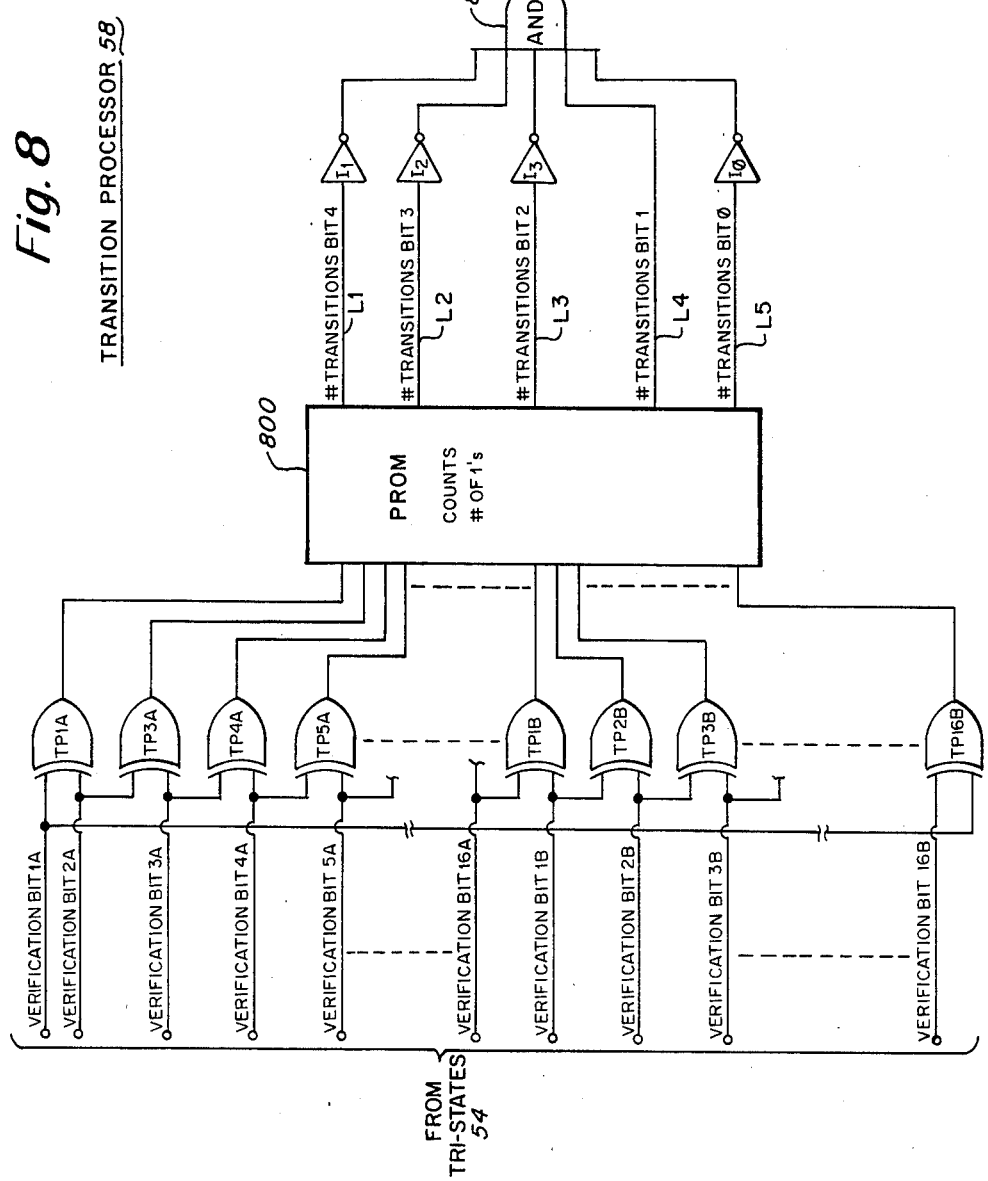

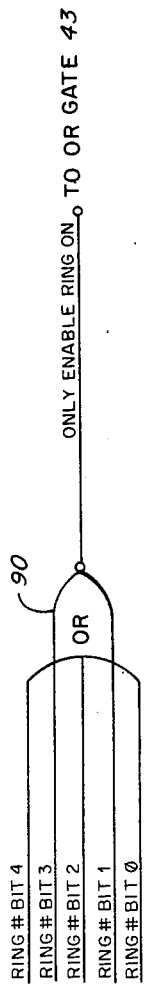
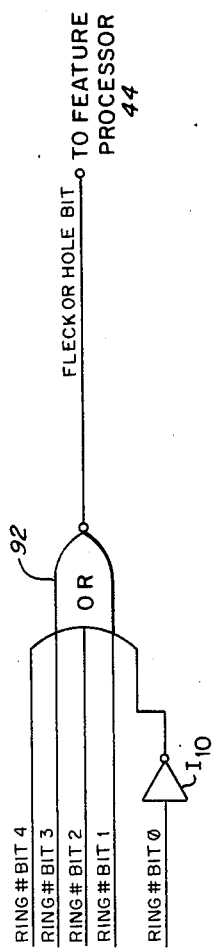
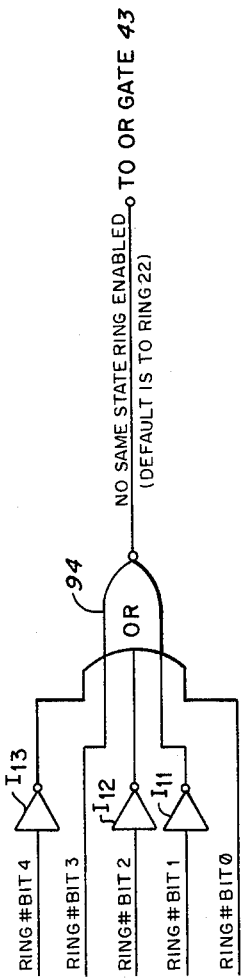
Fig. 9 ON ENABLE RING ONLY CIRCUIT 40
Fig. 10 SS-RING #=1 CIRCUIT 32
Fig. 11 SS-RING #=22 CIRCUIT 41

LEGEND

| | | DIA. |
|---|---|---|
| ENABLE RING | | 1.0 MIL |
| SAME STATE RING 3, | CR3 | 3.0 MILS |
| SAME STATE RING 6, | CR6 | 4.5 MILS |
| SAME STATE RING 9, | CR9 | 6.0 MILS |
| SAME STATE RING 12, | CR12 | 7.5 MILS |
| SAME STATE RING 15, | CR15 | 9.0 MILS |
| SAME STATE RING 18, | CR18 | 10.5 MILS |
| SAME STATE RING 21, | CR21 | 12.0 MILS |

LEGEND

| | | | DIA. |
|---|---|---|---|
| ▦ | SAME STATE RING 1, | CR1 | 2.0 MILS |
| ▤ | SAME STATE RING 4, | CR4 | 3.5 MILS |
| ▨ | SAME STATE RING 7, | CR7 | 5.0 MILS |
| ▨ | SAME STATE RING 10, | CR10 | 6.5 MILS |
| ▦ | SAME STATE RING 13, | CR13 | 8.0 MILS |
| ▦ | SAME STATE RING 16, | CR16 | 9.5 MILS |
| ▦ | SAME STATE RING 19, | CR19 | 11.0 MILS |
| ▤ | SAME STATE RING 22, | CR22 | 12.5 MILS |

LEGEND

| | | DIA. |
|---|---|---|
| ▦ | SAME STATE RING 2, CR2 | 2.5 MILS |
| ▤ | SAME STATE RING 5, CR5 | 4.0 MILS |
| ▨ | SAME STATE RING 8, CR8 | 5.5 MILS |
| ▧ | SAME STATE RING 11, CR11 | 7.0 MILS |
| ▦ | SAME STATE RING 14, CR14 | 8.5 MILS |
| ▩ | SAME STATE RING 17, CR17 | 10.0 MILS |
| ▦ | SAME STATE RING 20, CR20 | 11.5 MILS |
| ▤ | SAME STATE RING 23, CR23 | 13.0 MILS |

LEGEND

| | | DIA. |
|---|---|---|
| ▦ VERIFICATION RING 1 | | 5.5 MILS |
| ▤ VERIFICATION RING 2 | | 7.5 MILS |
| ▨ VERIFICATION RING 3 | | 9.5 MILS |
| ▩ VERIFICATION RING 4 | | 11.5 MILS |
| ▦ VERIFICATION RING 5 | | 13.5 MILS |
| ▦ VERIFICATION RING 6 | | 15.5 MILS |
| ▦ VERIFICATION RING 7 | | 18.0 MILS |

SYSTEM FOR PRINTED CIRCUIT BOARD DEFECT DETECTION

TECHNICAL FIELD

The present invention relates generally to an arrangement for optically inspecting the etched circuitry on a printed wiring board (PWB) or printed circuit boards (PCB), and more particularly pertains to an improved optical sensor for examining PWB's or PCB's for defects.

BACKGROUND ART

Manual inspection of a complex printed circuit board is, in many cases, as expensive as its manufacture because of the labor intensive activity involved therein. Workers in the art have tried many approaches to solving this problem.

The automated detection of defective printed wire/circuit boards presents a complex problem. Early approaches to automated inspection of printed wire boards tried image comparison techniques employing a master printed circuit board, artwork, or a computer stored map for a master and comparing the PCB or PWB to the master to ascertain defects. However, this concept was not generally satisfactory, because of troublesome problems that were encountered in practice. For example, in such comparative analysis, the instantaneous area of the scanned image, or pixel-under-test, must match the corresponding area of the master. Thus, exact alignment is necessary at every point on the board. Shrinking or swelling of the board due to changes in temperature or humidity must be compensated for. The comparative analysis must also take into account normal and perfectly acceptable variations in the widths of the lines and the spaces of the pattern. As a result of these problems, it presently appears that the complexities inherent in the mechanization of this comparative technique renders such systems only marginally economical as a replacement for human inspection.

Bentley in "The Inspectron: An Automated Optical Printed Circuit Board (PCB) inspector", *SPIE* Vol. 201, *Optical Pattern Recognition* (1979), p 37–47, discloses a different approach based upon the logic inherent in PWB design. In the Bentley system, an automated printed wire circuit board inspection machine is employed which mechanically scans a hardwired distance-measuring sensor array of photodetectors located over the circuit board and utilizes logical decisions based upon the image pattern of the illuminated and nonilluminated detector to detect defective circuit boards.

Restrick in "An Automatic Printed Circuit Inspection System" *SPIE* Vol. 116, *Solid State Imaging Devices* (1977) describes a logic-type system (hereinafter the Restrick system) for printed circuit inspection which does not require total mechanical scanning of the sensor array over the circuit board. Instead, optical sensors scan a swath of a board as the sample board moves by on a support table.

In the Restrick system, three sensing units, each scanning a swath of the moving sample, are used. A lens associated with each sensing unit images a moving sample onto a 1728 element linear solid-state optical sensor. Shift registers store individual line scans. A special purpose processor manipulates and temporarily stores the data. Digital logic to implement the error detecting algorithm is required for each sensing unit. Six consecutive scan lines are stored. The array scans in the Y-direction and the object is scanned mechanically in the X-direction. A bit stream is formed and stored in shift registers representing successive Y-positions for fixed X. Combinational logic applies line width/line spacing criteria to the contents of the registers. With each clock pulse a new area is stored in the shift registers and the error criteria applied.

U.S. patent application Ser. No. 521,069 filed Aug. 8, 1983 to MacFarlane discloses an improved printed circuit board defect detection system which is more flexible than the prior art Restrick or Bentley systems, in the sense that it can accommodate board to board line spacing and line width variations. It also is capable of detecting certain defects not otherwise detectable by the prior art systems, such as, the presence of unterminated lines.

In the MacFarlane system, pixel signals from each scanned line of a photodetector array, are accumulated in a plurality of shift registers, to form a moving "window" of matrix points. Each point in this matrix is in one of two possible logical states or polarities, depending on the instantaneous image, be it conductor or insulator, viewed by a corresponding photodetector element in the array.

Any of the pixel points in the matrix can be selected or addressed and a variety of logical principles applied thereto to determine if the image available in the matrix violates logical printed circuit board principles. Logic defects, such as (a) the presence of unterminated lines, (b) failure to meet minimum conductor width and spacing specifications, (c) the presence of holes in small areas of conductors or conductors in small areas of insulators, or (d) the presence of conductors having line widths in excess of specification can be detected.

A point select circuit capability permits the system to apply the defect detection logic to a plurality of inter-board line width and spacing sizes.

The MacFarlane system represents a considerable non-obvious advance over the prior art systems. Nevertheless, even greater flexibility is required to accommodate more recent printed circuit board designs. For example, newer printed circuit board designs employ conductor widths, which are non-uniform within a given board, i.e., intra-board variations. While the MacFarlane system is flexible enough to accommodate line-width and line-spacing variations from board-to-board, it cannot handle such intra-board line width variations.

Since the cost of a single automatic printed board defect sensor of the MacFarlane type is in excess of several hundred thousand dollars, its inability to detect defects in line width on printed circuit boards having more than one fixed line width represents a severe limitation upon its usefulness for more advanced PCB or PWB designs.

Additionally, the MacFarlane system does not have the capability of determining if a feature under inspection is centered. Hence, false defects may be indicated in the MacFarlane system if the feature is, in fact, not centered.

Also, in the MacFarlane system, there is no provision for determining the edge of a feature under inspection. Therefore, determination of feature size cannot be directly established by measuring the distance between edges.

Finally, in the MacFarlane system, the defect detection logic is somewhat limited in its accuracy for detection of complex circuit patterns. For example, features such as V-shaped conductor patterns, i.e., Vees, neck-downs, i.e.; narrowing down of conductors and stubs either cannot be detected or detected with a high degree of accuracy.

DISCLOSURE OF THE INVENTION

A PWB or PCB defect sensor system is disclosed which, among other things, is capable of detecting defects in printed conductor line spacings and line width wherein the width and spacing varies within a given board. The present system utilizes a moving "window" or matrix of pixels available in a photodetector array. The pixel array represents the instantaneous image of portions of a PCB under inspection.

Binary pixel patterns are selected from the matrix and logical principles applied thereto to determine PWB defects. Three basic patterns are selected. The first pattern is an Enable pattern comprising two vertical and two horizontal pixel points in the approximate center of the matrix. This pattern forms an Enable "Ring"* which is used to determine if the center of the "window" is possibly on a conductor (in which case all pixels will be in a first state, i.e., "high") or on an insulator (in which case, all pixels will be in an opposite state, i.e., "low") or partly on a conductor and partly on an insulator (in which case, some pixels will be "high" and some "low").

*While the term "ring" may be used herein, it should be noted that the matrix "window" is a grid structure in the preferred embodiment of 36×36 pixels, each 0.5 mils square and the patterns are therefore not uniformly circular.

The second pattern is a set of Same State Ring (SS-Ring) patterns which comprise a plurality of rings of pixel points concentric to the center of the matrix and progressing in size from an inner SS-Ring to an outer SS-Ring. The SS-Rings are used to locate the edge of a feature and to select a Measurement Ring (M-Ring) pattern to measure the width of the feature under inspection and to select a Centering Ring (CR-Ring) to determine if the feature is centered in the "window".

For feature "edge" determination, the states of each pixel in an SS-Ring are examined progressing from the innermost SS-Ring to determine if all pixels in a ring are in the same state. The largest diameter SS-Ring having all pixels in the same state (i.e., the LD SS-Ring) is thereby determined. The number of the LD SS-Ring is encoded as a 5 digit Binary number and stored. The identity of the LD SS-Ring is used to select one of the SS-Rings to be used as a CR-Ring to determine if the "window" is centered on the feature. The other purpose of the LD SS-Ring is to select one of a plurality of Verification Rings (V-Rings). The V-Rings are used to determine the nature of a feature, that is, to verify if a feature is truly a valid conductor or valid insulator, as the case may be.

To determine the nature of a feature, a V-Ring is selected, based upon the stored information identifying the LD SS-Ring. The selected V-Ring is the smallest diameter ring within which a square will fit which is centered at the center of the LD SS-Ring and which square has a width equal to the diameter of such LD SS-Ring.

The pixels on the selected V-Ring are processed to count the number of:

(1) opposite pixel pairs both in a first state (i.e., high-=on conductor);

(2) opposite pixel pairs both in an opposite state to the first state (i.e., low=on insulator);

(3) opposite pixel pairs of different states;

(4) pixels in the first state (i.e., high=on conductor); and (5) transitions in the V-Ring from one state to another among adjacent pixel pairs.

Based upon these counts and the state of the Enable pattern, which indicates whether the window is centered on a conductor or an insulator, certain tests are performed in a Feature Processor, in accordance with a predetermined program.

Assuming the window is centered on a conductor feature, the following tests are performed. First, a test is made to determine if the feature is a fleck of copper; next, a test is made to determine if the feature is too large to be inspected, i.e., on a pad. Then, a test is made to determine if the feature is a line. If it is a line, a test is made to determine if the line is of proper width. After that, a line break test is made which also checks to make sure the feature is not a corner. Then a check is made to determine if the feature is a V-shaped defect, and finally, a check is made to determine if the feature is either a neck-down or a stub.

Similarly, if the window is centered on an insulator feature, the following tests are performed. First, a test is made to determine if the feature is a pinhole. Next, a test is made to determine if the insulative feature is a valid space. If it is, a spacing width violation test is made.

If, at any point, a defect is found, the defect is indicated and the test routine terminated. Similarly, if a no defect condition is found, a quit bit is generated and further test processing is terminated.

The above tests are performed by comparing pixel state data accumulated by the sensor with pre-stored values in a RAM-Look Up table. These values are of two types. The first type comprises pre-calculated maximum or minimum allowable values of pixel states. The second set of values comprise user programmed pass-/fail bits corresponding to valid feature sizes or allowability of neck-down patterns.

BRIEF DESCRIPTION OF THE DRAWING

FIG. 2 is a schematic illustration of the control circuitry 4 of FIG. 1.

FIG. 3 is a schematic illustration of the same-state determination circuitry 6 of FIG. 1.

FIG. 4 is a schematic illustration of the largest SS-Ring circuit 28 and M-Ring with Tri-states circuit 38 of FIG. 1.

FIG. 5 is a schematic diagram of the storage circuit and peripherals of FIG. 1.

FIG. 8 is a schematic of the transition processor 58 of FIG. 1.

FIG. 9 is a schematic of the Only Enable Ring On Logic circuit 40 of FIG. 1.

FIG. 10 is a schematic of the Fleck or Hole Bit Logic circuit 32 of FIG. 1.

FIG. 11 is a schematic of the No Same State Ring Enabled circuit 41 of FIG. 1.

BEST MODE OF CARRYING OUT THE INVENTION

The logic utilized by the present invention is based upon given inherent characteristics of a correctly produced printed wire circuit board, including the following:

1. All circuit lines end in pads, and any line that does not is almost certainly broken, and can be considered an error.
2. All circuit lines have a specified minimum and maximum width.
3. Any copper feature the smallest dimension of which is much larger than a standard line but smaller than a pad is an error, either a broken pad or a spurious copper blob.
4. The pad diameters are much larger than the line widths.
5. Lines do not turn at angles greater than 90 degrees.

New high density or fine line printed wiring boards are characterized by conductor widths ranging from 3 to 20 mils and similar values of spacing. Two or three different size line widths may be found on a single board. It may be permissible for some lines to gradually decrease in width, i.e., neck-downs:

The present invention detects defects in such state-of-the-art printed-wiring circuit boards with a 36×36 matrix array of 1296 pixel sensors wherein each pixel sensor images a 0.5 mil×0.5 mil area of the PWB. The sensors are binary in that they register a ONE if looking at conductive material, and a ZERO otherwise. With a typical printed circuit board, each detector is energized to an "ON" or ONE-state by reflection from a pixel (the increment of area which the detector is examining) formed of bright copper, and each detector is de-energized to an "OFF" or ZERO-state by reflection from a pixel formed from the matte substrate insulator. The 36×36 pixel matrix is formed, as described in the co-pending MacFarlane U.S. patent application Ser. No. 521,069, incorporated herein by reference. A moving "window" or image is provided as the board under inspection is scanned by CCD arrays. Selected points on this window are then addressed and logic applied to test for defects in a continuous manner.

A plurality of shift registers (in this case (36) contain an addressable matrix of 1296 bits representing a 36×36 bit moving "window" corresponding to a portion of the image sensed at a particular point in time by the CCD arrays. The matrix is continuously being updated, pixel-by-pixel, such that each of the 10240 pixels constituting one entire scanned image of the CCD array sequentially passes through each point in the matrix. These points can be addressed and sampled by suitable point selection circuitry, all as described in the MacFarlane application.

The point of departure between the present invention and the MacFarlane system occurs in the treatment of the pixel information contained in the 36×36 matrix. How this information is utilized to determine PWB defects will now be described in connection with the figures.

Figure 1:
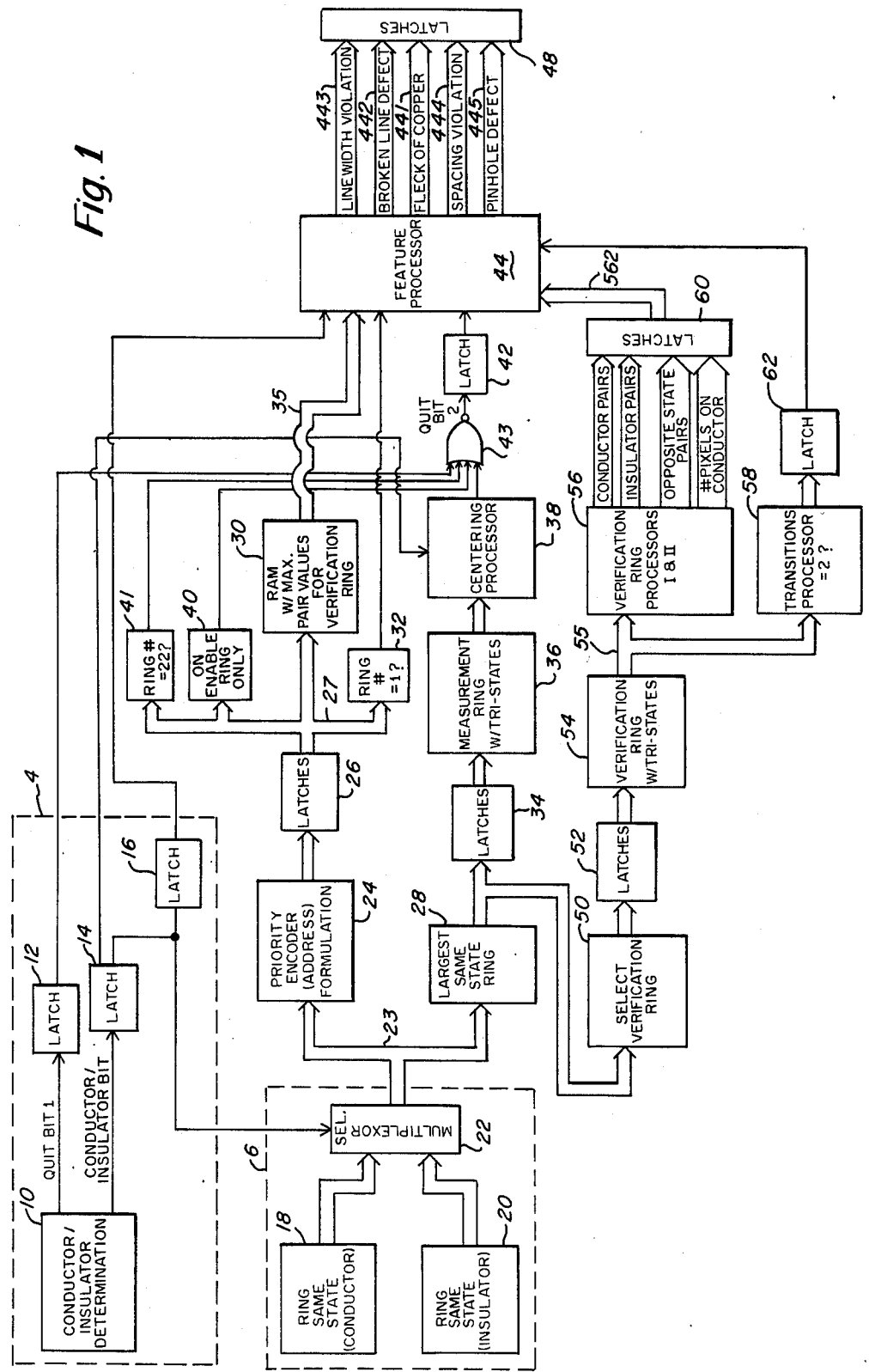
FIG. 1 is a schematic block diagram of a preferred embodiment of the defect sensor of the invention.

Referring now to FIG. 1, an overall block diagram of the printed wiring board defect sensor will now be utilized in conjunction with detailed schematic drawings of specific circuits to describe the system.

I. Control Circuitry 4

Figure 12A:
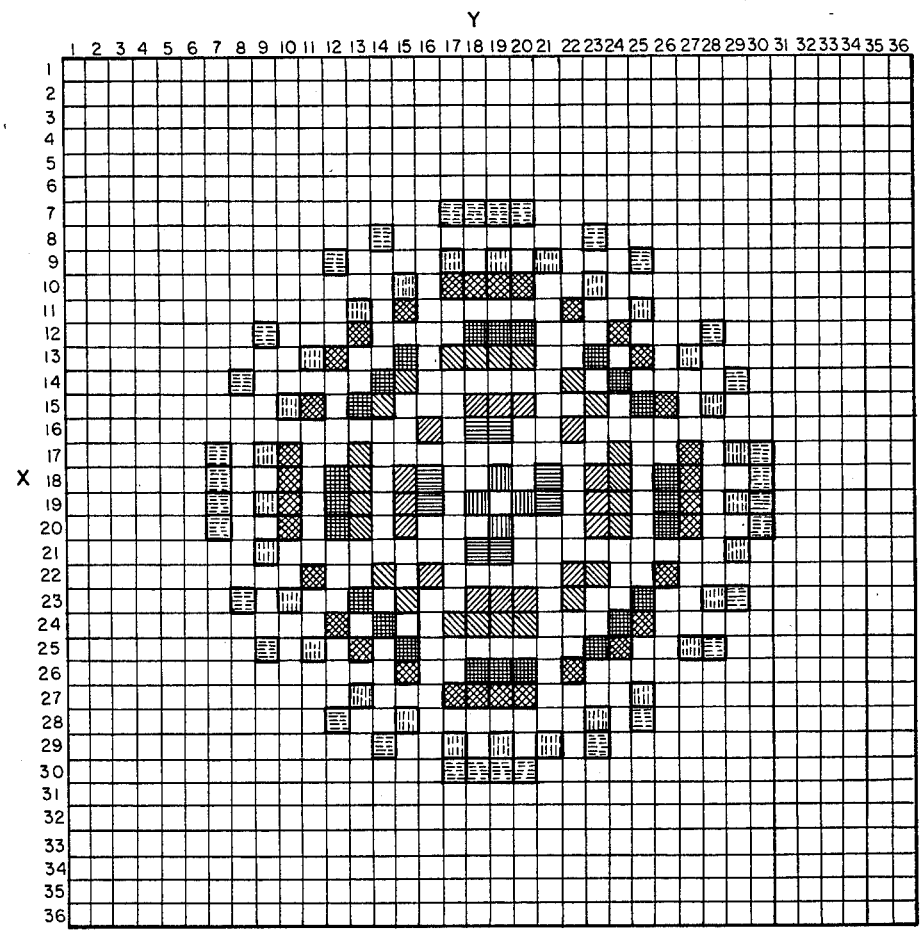
FIGS. 12a-c show the patterns for the Enable Ring and the SS/CR Rings 1-23.
Figure 12:
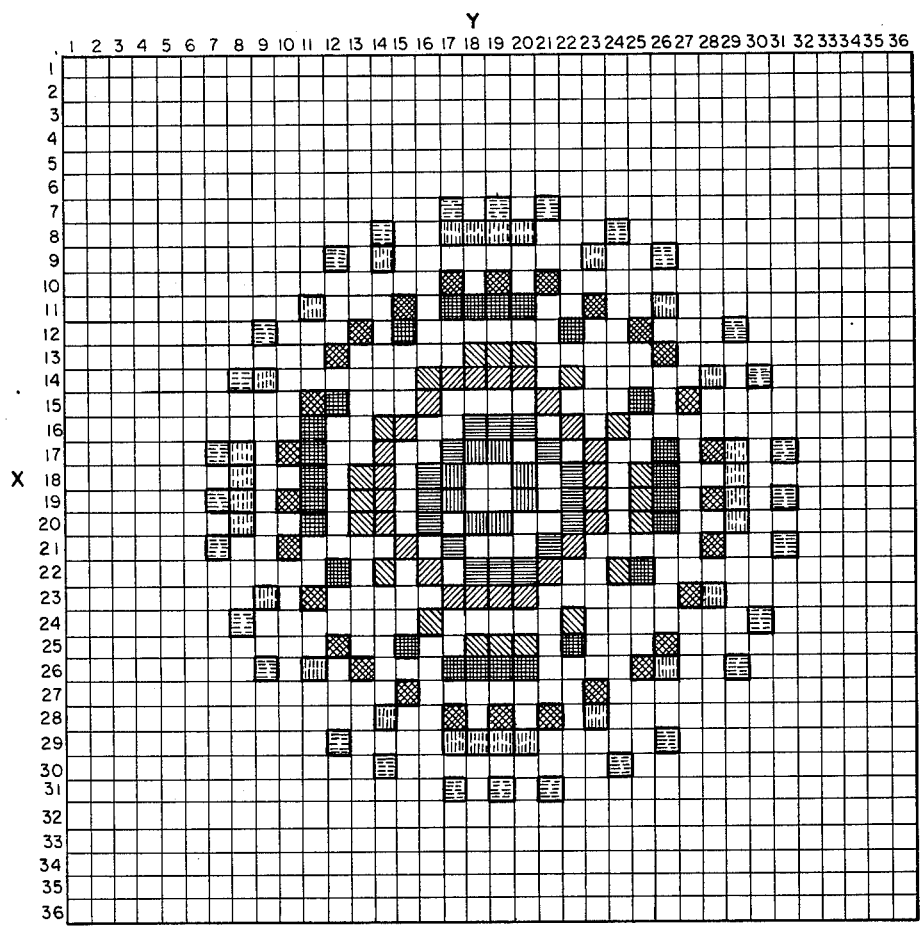

The first step in the process is to determine if the printed wiring board feature under inspection could possibly be either a conductor or an insulator. This determination is made in the control circuitry 4 of FIG. 1, which is shown in more detail in FIG. 2. As shown in FIG. 2, four pixel bits from an Enable ring are coupled over data buss 11 to the input terminals of NOR Gate 3 and NAND Gate 5. The Enable Ring is shown in FIG. 12a. The four pixels may be seen to be approximately centered on the matrix window.

As shown in Table I below, if the Enable ring pixels are all imaged on a conductor, the 4-bit enable data will all be "highs" or ONE's and the output of NOR Gate 3 and NAND Gate 5 will be be ZERO's or "lows".

TABLE I

| Enable Ring | | Out NOR(3) | Out NAND(5) | In EXC. OR (7) | Out | In NOR (9) | Out |
|---|---|---|---|---|---|---|---|
| Cond. | 1111 | 0 | 0 | 0 | 0 | 0 | 1 |
|  |  |  |  | 0 |  | 0 | conductor |
| Ins. | 0000 | 1 | 1 | 1 | 0 | 1 | 0 |
|  |  |  |  | 1 |  | 1 | insulator |
| ? | 1100 | 0 | 1 | 0 | 1 | 0 | 0 |
|  |  |  |  | 1 |  | 1 |  |

Thus the input to Exclusive OR Gate 7 will be two ZERO's resulting in a ZERO output, which is an Enable bit.

Similarly, if the 4-bit Enable data are all ZEROs, it may be seen from Table I, above, that the output of Exclusive OR Gate 7 will also be an Enable bit, i.e., a ZERO. However, if the 4-bit enable data contains some ZEROs and some ONE's indicating that the window is centered on a partially conductive and partially insulative feature, the output of NOR Gate 3 will be a ZERO and the output of NAND Gate 5 will be a ONE. With these inputs to the Exclusive OR Gate 7, the output of Gate 7 will be a "high" or ONE which is a Quit bit indicating to the sensor circuitry that it is not appropriate to conduct further measurements on this feature, i.e., that no defect can exist at this location. Thus, the system is recycled by this Quit bit to proceed to a next cycle and another set of Enable data.

The output of NOR Gate 3 and NAND Gate 5 are also fed to the two input terminals of NOR Gate 9 to determine if the feature is a conductor or an insulator. If the feature is a conductor, a ONE-bit output is obtained from NOR Gate 9, as may be seen in Table I, whereas if 4-bits of the Enable ring are all on ZEROs, a ZERO output is obtained from NOR Gate 9, indicating that the feature is an insulator. The information obtained from the Exclusive OR Gate 7 and NOR Gate 9 is maintained for three cycles by storing it in the flip-flop latches 12, 14 and 16 and placing the new data in the preceding flip-flop latch. This storage feature is required in order to obtain the proper amount of information into the system prior to processing it in the feature processor 44 and verification ring processors 56 and centering processor 38.

The output of latch 14 is coupled to multiplexor 22 in the Same State Determination Circuit 6, which will now be described in connection with FIG. 3.

II. Same State Determination Circuit 6

Figure 12C:
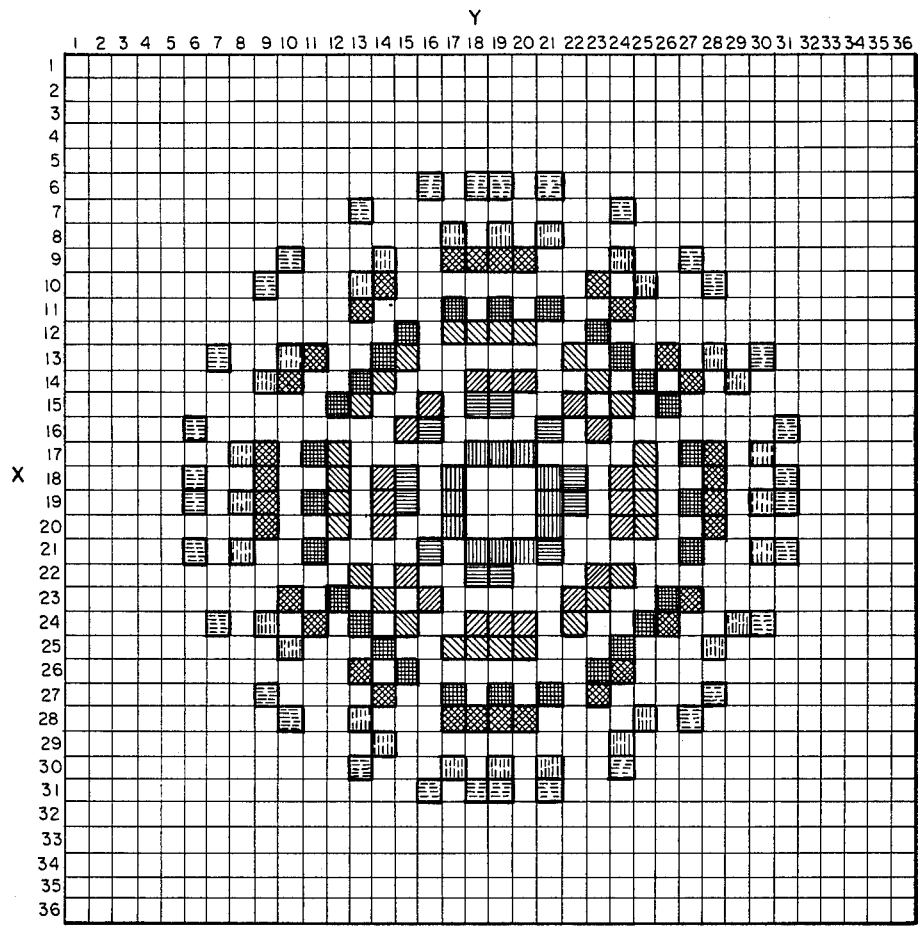
Figure 13:
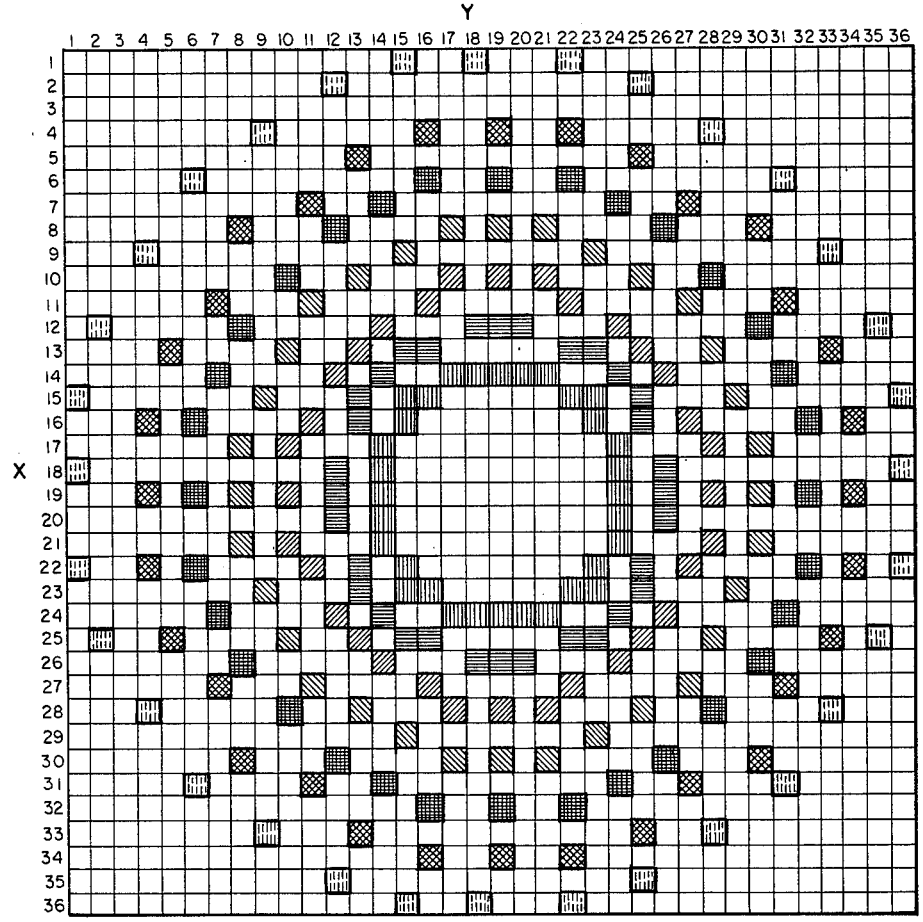
FIG. 13 shows the pixel pattern for the V-Rings 1-7.

The purpose of the Same State Determination Circuit is to determine the largest SS-Ring in which all the pixels of a ring are in the same state. There are twenty-three SS-Rings, as shown in FIGS. 12a–12c, each progessively larger. The diameter (cross-sectional width) of SS-Ring 1 is 2 mils and comprises 8 pixels, whereas the diameter of the SS-Ring 23 is 13 mils and contains 32 pixels. All the pixels in SS-Ring 1 are coupled-via data buss 11 to the input terminals of NAND Gate R1 and OR Gate R1, as shown in FIG. 3.

Assume, for example, that all the pixels in SS-Ring 1 are imaging a conductor, then all the SS-Ring 1 pixels will be in a "high" state producing ONE-bits at the inputs to NAND Gate R1 and OR Gate R1. In this case, the NAND output will be a ZERO bit and the OR output will be a ONE bit. The state bit from latch 14 determines which of the NAND or OR Gate signals will be passed through the multiplexors to the priority encoder 24 and the last Same State Ring Indicator 23. If the same state bit is a conductor bit, i.e., a ONE, then the NAND Gate bit is passed, which in this case, will be a ZERO bit indicating that all the pixels in SS-Ring 1 are on a conductor. In the event that the enable bit was a ZERO, indicating an insulator, then the OR Gate 1 output would be passed through the multiplexor R1. This bit would also be a ZERO if the input to OR Gate R1 were all ZEROs, indicating that all the pixels in SS-Ring 1 were imaging an insulator.

It is only when one or more pixels in an SS-Ring change pixel states that a ZERO output will be passed from the multiplexors to the Priority Encoder 24 or Last Same State Ring Indicator 23. For example, if one of the pixels in SS-Ring 3 is a ZERO while all the pixels in previous SS-Rings 1 and 2 were ONE's, the output from MUX R3 would be a ZERO indicating that this is the first SS-Ring in which all the pixels were not in the same state.

The output of the Same State Determination circuit 6 are fed in parallel to Priority Encoder 24. The last 1-bit before the first 0-bit corresponds to the Last or Largest Diameter Same State Ring (LD SS-Ring) in which all the pixels are in the same state. The ring number of the LD SS-Ring which produces a 1-bit at the input to the Priority Encoder is encoded as a 5-bit binary address by the encoder 24 and stored in latch 26.

The output of the multiplexors 22 are the inverse of the bit being passed so that the outputs will be ONE-bits until a Same State bit ring is reached in which all the pixels are not in the same state. These outputs are fed in parallel to the Largest Same State Ring circuit 28, which toggles a bit corresponding to the last Same State ring in a series of similar Same State rings.

As may be seen in FIG. 4, the Largest Diameter Same State Ring Circuit 28 comprises a column of NAND gates (NAND's RS1/2 through RS1-22/23), each feeding a row of Tri-State diodes in Selection Circuit 36. There is one NAND Gate circuit for each SS-Ring, except the last two SS-Rings 22 and 23. Each NAND Gate has as inputs the Same State bit from MUX 22 corresponding to (a) the state of an SS-Ring, as determined in SS Determination Circuit 6, (b) the SS bit for each preceding SS-Ring of lesser diameter, and (c) the inverse of the pixel bits from the next largest diameter ring.

Assume that the feature viewed by the window is a centered insulator of width equal to 2.5 mils. Under these circumstances, the LD SS-Ring would be SS-Ring 2. The SS-Ring bit output from MUX 22 for SS-Rings 1 and 2 in this case will both be ONES and for SS-Ring 3 will be a ZERO. Note that MUX 22 performs an inversion. Thus, the inputs to the first NAND Gate RS1/2 will be a ONE and a ZERO since the SS-Ring 2 bit is inverted in $I_1$. However, the inputs to the second NAND Gate RS1-2/3 will all be ONES since the ZERO bit from SS-Ring 3 is inverted by $I_2$. The output of NAND RS1/2 is therefore a ONE signifying that all pixels in SS-Rings 1 and 2 are in the same state. However, the output of NAND RS1, 2/3 is, in this case only, a ZERO, signifying that this SS-Ring 2 is the last SS-Ring in which all pixels are in the same state.

Note that the next NAND Gate in the column, NAND RS1-3/4 does not produce a ZERO output since the SS-Ring 3 input is not inverted. Thus, the input to NAND RS1-3/4 is a 1,1,0,1 in this hypothetical case; thus producing a ONE output from NAND RS1-3/4.

The ZERO bit from NAND RS1,2/3 is thus used to select the pixel bits from C-Ring 4 present at the input leads to Tri-State diode buffers TS 21-TS 2N, wherein N—number of pixels in a ring. These input pixels are labelled CR4-1A through CR4-16A CR4-1B through CR4-16B. Referring to FIG. 12b, CR4-1A is the pixel located at X16, Y19 in the 36×36 pixel window. These ring bits are taken off the Tri-State Centering Ring selector circuit 36 from the leads labelled CR4-1A and coupled in parallel to Centering Processor 38.

The ZERO enable signal from one of the NAND gates, NAND RS1/2–RS-21/22, is also coupled via leads V-1 to a 7×N matrix 54 of Tri-State diodes similar to those shown in FIG. 4; except that the Tri-State diode inputs contain the pixel data from each of seven Verification or V-Rings, which are selected based upon which of the SS-Rings is the last one in which all pixels are in the same state. Table II is a typical listing showing which of the seven V-Rings is selected by number and figure and the diameter of such ring.

TABLE II

| Last SS-Ring In Which All Pixels in Same State | V-Ring Selected | FIG. #13 | Diameter in mils |
|---|---|---|---|
| SS1 | 1 | a | 5.5 |
| 2 | 1 | a | 5.5 |
| 3 | 1 | a | 5.5 |
| 4 | 2 | b | 7.5 |
| 5 | 2 | b | 7.5 |
| 6 | 3 | c | 9.5 |
| 7 | 3 | c | 9.5 |
| 8 | 3 | c | 9.5 |
| 9 | 4 | d | 11.5 |
| 10 | 4 | d | 11.5 |
| 11 | 4 | d | 11.5 |
| 12 | 5 | e | 13.5 |
| 13 | 5 | e | 13.5 |
| 14 | 5 | e | 13.5 |
| 15 | 6 | f | 15.5 |
| 16 | 6 | f | 15.5 |
| 17 | 6 | f | 15.5 |
| 18 | 7 | g | 18.0 |
| 19 | 7 | g | 18.0 |
| 20 | 7 | g | 18.0 |
| 21 | 7 | g | 18.0 |

The function of the V-Rings is to provide pixel points external to the feature under inspection so that areas around the feature can be inspected for the purpose of determining feature defects.

The selected pixel bits from V-Ring Tri-states circuit 54 are coupled via buss 55 to V-Ring Processor 56 and Transition Processor 58.

IV. Encoding and Storage for Comparison Tables (24 & 30)

The bit output from Multiplexers 22 constitutes a parallel bit stream of ONE'S followed by a ZERO when an SS-Ring is encountered in which all pixels are not in the same-state. Assume that this situation first occurs at SS-Ring 3. The bit stream is then 110-$O_N$, which is coupled to Encoder 24. Encoder 24 encodes the number 2 in response to this bit stream as a 5-bit binary number, i.e., 00010, which is buffered in latch 26 and then coupled via buss 27 to RAM circuit 30.

RAM circuit 30 contains an addressable 21 element by 20-bit random access memory RAM 1, FIG. 5, into which a look-up table of data is written in binary fashion. A sample table is shown in Table III below:

TABLE III

| 1 RING | 2 MAXSYMCOND | 3 MAXNSYM | 4 MAXSYMINS | 5 MINCOND | 6 T/FCOND | 7 T/FINS | 8 LTMIN | 9 NCDWN |
|---|---|---|---|---|---|---|---|---|
| 1 | 5 | 5 | 6 | 8 | 0 | 0 | 1 | 1 |
| 2 | 7 | 3 | 5 | 8 | 0 | 0 | 1 | 1 |
| 3 | 8 | 5 | 5 | 10 | 0 | 0 | 1 | 1 |
| 4 | 7 | 3 | 5 | 8 | 0 | 1 | 1 | 1 |
| 5 | 8 | 4 | 4 | 10 | 1 | 1 | 0 | 1 |
| 6 | 7 | 3 | 4 | 8 | 1 | 1 | 0 | 1 |
| 7 | 7 | 4 | 4 | 10 | 1 | 1 | 0 | 1 |
| 8 | 9 | 3 | 3 | 12 | 0 | 1 | 0 | 1 |
| 9 | 7 | 3 | 4 | 10 | 0 | 1 | 0 | 1 |
| 10 | 8 | 3 | 4 | 10 | 0 | 1 | 0 | 1 |
| 11 | 8 | 3 | 3 | 12 | 1 | 1 | 0 | 1 |
| 12 | 8 | 3 | 3 | 10 | 1 | 1 | 0 | 1 |
| 13 | 8 | 3 | 3 | 12 | 1 | 1 | 0 | 1 |
| 14 | 9 | 3 | 2 | 12 | 0 | 1 | 0 | 1 |
| 15 | 8 | 3 | 2 | 11 | 0 | 1 | 0 | 1 |
| 16 | 8 | 3 | 3 | 12 | 0 | 1 | 0 | 1 |
| 17 | 9 | 3 | 2 | 13 | 0 | 1 | 0 | 1 |
| 18 | 8 | 3 | 2 | 12 | 0 | 1 | 0 | 1 |
| 19 | 8 | 3 | 3 | 12 | 0 | 1 | 0 | 1 |
| 20 | 9 | 3 | 3 | 13 | 0 | 1 | 0 | 1 |
| 21 | 9 | 3 | 3 | 13 | 0 | 1 | 0 | 1 |

Col. 1 = LD SS-Ring #
Col. 2 = Maximum Symmetric Pixel Pairs? on Conductor
Col. 3 = Maximum Non-Symmetric Pixel Pairs
Col. 4 = Maximum Symmetric Pixels Pairs? on Insulator
Col. 5 = Minimum Number Pixels on Conductor
Col. 6 = Pass/Fail Test Re Conductor Size
Col. 7 = Pass/Fail Test Re Insulator Size
Col. 8 = Ring # for Less Than Minimum Diameter Test (Test for Vees)
Col. 9 = Allowable Neck-Downs 1 = NO 0 = YES Table III functions as follows:

Only one row of columns is selected depending upon which LD SS-Ring is the LD SS-Ring as sensed by the sensor. Thus, if as in our example, the LD SS-Ring is SS-Ring 2, the row corresponding to SS-Ring 2 is selected. The stored test criteria in Look-Up Table III for Ring #2 are shown in columns 2-9, row Ring #2. Note that, if examining a conductor and a line is found to exist, the only permissible line widths would be 4-5 mils or 7-8 mils.

Further details of the operation of Table III will be provided in connection with Flow Charts 14 and 15 and Feature Processor 44. The data in the table is accessed by coupling the SS-Ring Address Binary Number, i.e., 00010 through Multiplexor 306 to RAM 1.

As shown in FIG. 5, RAM 1 operates in two modes; a Load Mode and a Continuous Operation Mode. The RAM is loaded by a control board (not shown) which sends an Address signal to MUX 306, Data information to RAM 1 via Tri-State 302 and control bits via inverter 301.

Multiplexer 306 is enabled by a Mux Enable signal from the control board. MUX 306 is in one state on position for loading and an opposite position for accessing data in RAM 1. The Load RAM signal designates whether the control board or RAM controls the data buss 316 by enabling Tri-State 302 which passes reference data to RAM 1.

In the Continuous Operation Mode, sensor data is selected and RAM 1 controls the buss. Data is clocked into FF 304 from RAM 1 and coupled out via buss 314.

To write in data, both the Load SS RAM input and the $\overline{\text{WRAM}}$ input are set low when data from the control board is valid. These two low inputs are Exclusive OR'd in Gate 305 to produce a low output to the Chip Select input of RAM 1. The WRITE ENABLE input is also low at this time allowing the RAM 1 to be written into.

During normal operation, the $\overline{\text{LOAD SSRAM}}$ and $\overline{\text{WRAM}}$ signals are both high, thus the Chip Select is set low to enable the RAM 1 and $\overline{\text{WRITE ENABLE}}$ signal stays high leaving RAM 1 in the Read Only mode.

The data from RAM 1 is coupled from Flip-Flop 304 over data buss 314 to Feature Processor 44 at an appropriate time interval determined by clock pulse $\phi N$.

V. Centering Processor 38

Figure 6:
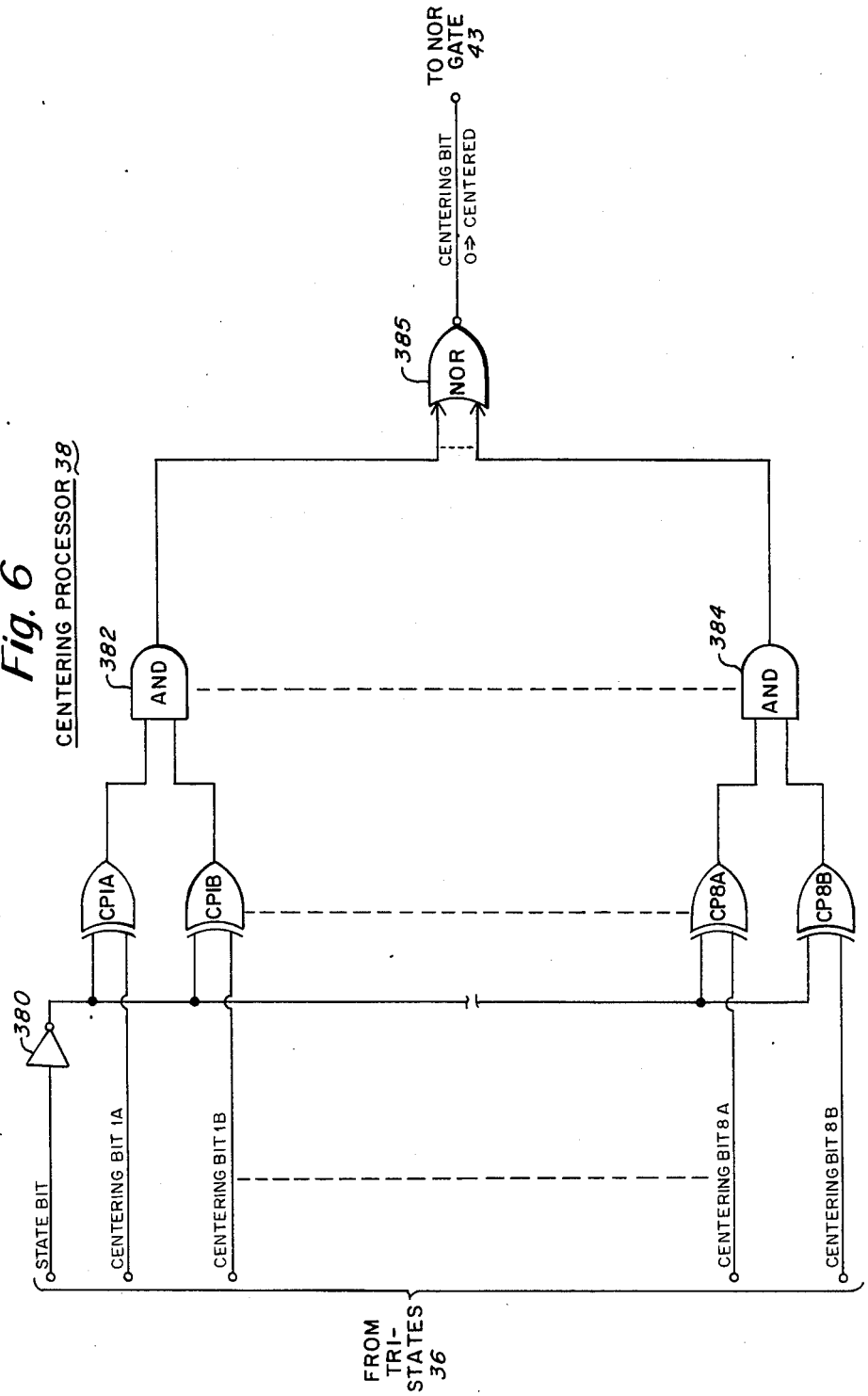
FIG. 6 is a schematic of the centering processor 38 of FIG. 1.

Referring now to FIG. 6, the details of the centering processor 38 will now be described in connection therewith. The function of the centering processor is to determine if the matrix window is possibly centered on a feature. It does so by examining the state of opposite pixel pairs on the CR-Ring as selected by Tri-State 36. A feature is deemed to be centered if one pair of opposite pixels of the CR-Ring are in the same state, and opposite the state of the Enable Ring.

Assume that the LD SS-Ring is SS-Ring 2, then the CR-Ring will be CR-4. Note that the centering ring is always one mil larger in diameter than the SS-Ring. CR-Ring 4 has 16 pixels (See FIG. 12b), therefore in this case, there are eight opposite pixel pair measurements to be made. As shown in FIG. 6, opposite pixel pairs (1A and 1B, ..., 8A and 8B) from SS-Ring 4 (CR4), are inputted to Exclusive OR Gates (CP1A and CP1B, ... CP8A and CP8B), while the remaining input leads of each Exclusive OR Gate are provided with the State bit from control circuit 4 which is inverted in Invertor 380 to a ONE if on insulator or a ZERO if on conductor. Thus, the Exclusive OR Gates may be seen to convert the data to the appropriate state depending upon whether the feature is a conductor or insulator for further processing. The AND gates (382-384) then find the opposite state pairs.

If the C-Ring is centered on a feature, say for example, an insulator, then the state bit inputs to all the Exclusive OR Gates will in each case be a ONE. The centering bit data is inverted by the Exclusive OR Gates CP1A, CP1B-CP8A, CP8B. Note that the Centering bits enter the processor 38 inverted. Therefore, to determine if a feature is centered, each pair of pixels are examined to determine if they are each ZERO's or not through the Logic Circuit. If both pixels in the pair are on conductor, the output of CP1A and CP1B will both be ONE's which are AND'ed in AND Gate 382 and coupled to NOR Gate 384. Each set of opposite pixel pairs is similarly examined and coupled to NOR Gate 384.

The output of NOR Gate 384 will either be a ZERO bit indicating that a feature is centered or a ONE bit indicating that it is not centered. This centering bit is coupled to NOR Gate 54 of FIG. 1.

VI. Verification or V-Ring Processor 56

The V-Ring Processor 56 will now be described in connection with FIG. 7. The V-Ring Processor may be considered to have two sets of data inputs for explanatory purposes. However, the data is actually identical.

Figure 7:
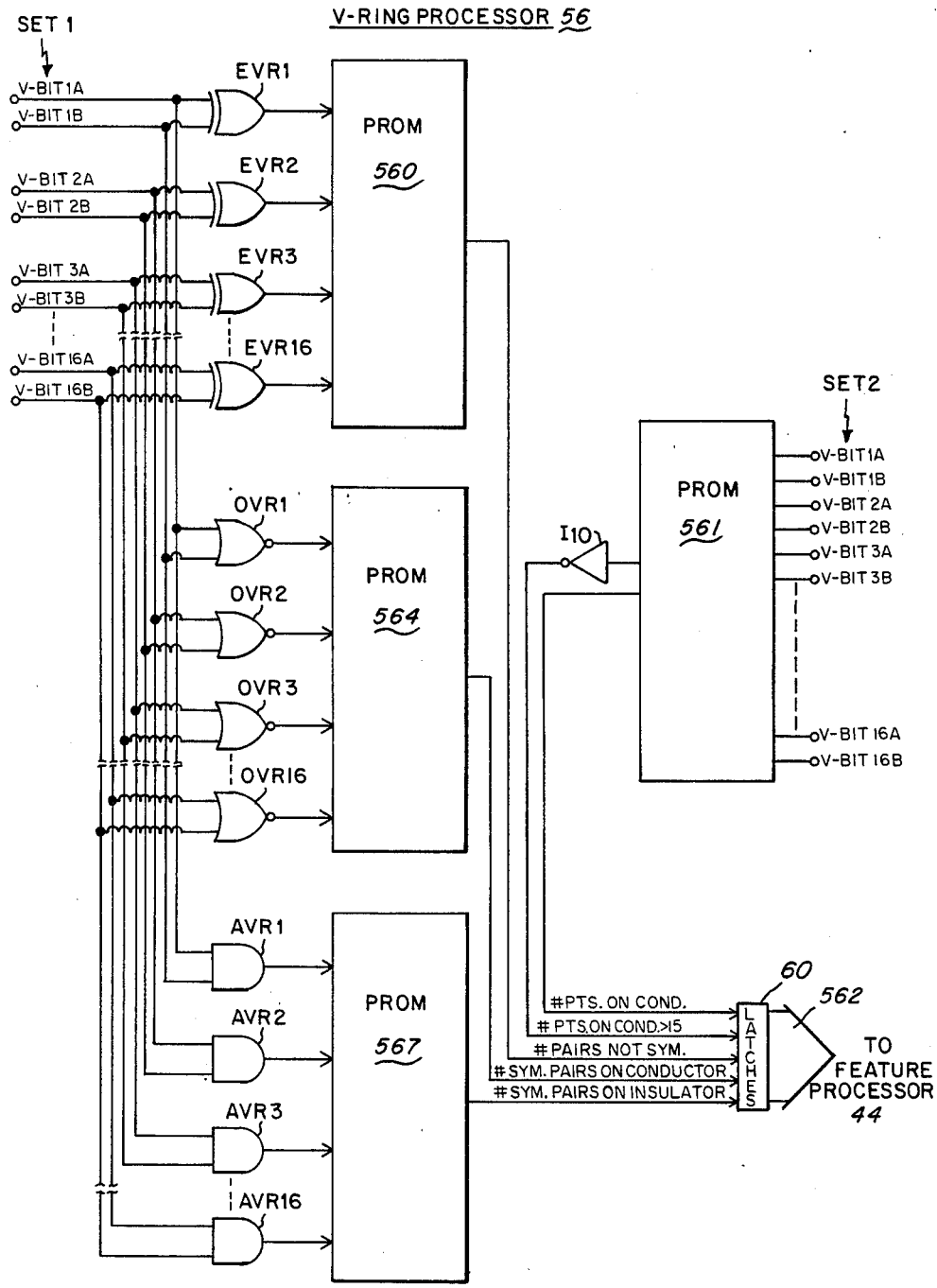
FIG. 7 is a schematic of the verification ring processor 56 of FIG. 1.

One set, labelled SET 1 in FIG. 7, consists of the opposite pixel pairs from the selected V-Ring. These pixel bits are processed to determine:
1. the number of pixel pairs not symmetrical;
2. the number of symmetric pixel pairs on a conductor feature; and
3. the number of symmetric pixel pairs on an insulator feature.

The other set, labelled SET 2, of input data comprises each pixel bit on the selected Verification ring. These bits are coupled in parallel to a Programmable Read Only Memory (PROM 561) which counts the number of ZERO bits to determine the total number of V-Ring pixels imaged on a conductor and produces a 4-bit binary number corresponding thereto. This number is coupled to Feature Processor 44 after storage in latches 60. PROM 561 also produces a ONE bit Quit output signal [labelled "# pts on conductor>15"] when the count of pixel points on a conductor exceeds 15. This Quit bit is also stored in latches 60 and coupled to Feature Processor 44.

The remainder of the V-Ring Processor comprises three separate columns of gates; Exclusive OR Gates EVR 1-16; NOR Gates OVR1-16 and AND Gates AVR1-16, as shown in FIG. 7. Each pair of opposite pixel bits from the selected V-Ring are coupled to a respective gate. The number of non-symmetric pairs is determined by coupling the outputs of the Exclusive OR Gates EVR1-16 to PROM 560 which simply counts the number of ONE inputs to PROM 560 and produces a corresponding 5-bit binary number on buss 566 to Feature Processor 44.

Likewise, the number of symmetric (opposite) pixel pairs on a conductor is established by coupling the outputs of NOR Gates OVR1-16 to PROM 564 which simply counts the number of ONE inputs to PROM 564 and produces a binary number corresponding to the count which is coupled via buss 566 to Feature Processor 44.

Note that the input to the NOR Gates has been inverted by the Tri-States so that pixel conductor bits are ZERO's and pixel insulator bits are ONE's at NOR Gates OVR1-OVR16. Thus, NOR Gates OVR1-16 will have 0,0, inputs if both opposite pixel pairs are on conductors, thereby resulting in ONE bit outputs to PROM 564.

Similarly, the number of pixel pairs on an insulator are determined in PROM 567 by counting the number of ONE's from AND Gates AVR1-16. This number is also coupled through buss 562, and latches 60 (FIG. 1) to the Feature Processor 44.

VII. Transition Processor 58 (FIG. 8)

The Transition Processor 58 determines the number of transitions in pixel state, i.e., high to low or vice versa, which occur in going from one pixel to an adjacent pixel in a pair. In a normal feature, such as a straight conductor, the number of such transitions would be four. However, if the matrix window were centered on a broken line, only two transitions would occur. This defect is detected in transition processor 58. Successive adjacent pixel bits from the selected V-Ring are coupled from Tri-State circuit 54 to Exclusive OR Gates TP1A-TP16B. Any opposite state pair input to Exclusive OR Gates TP1A-16B yields a ONE output. The number of ONE outputs, which is equal to the number of transitions, is counted in PROM 800. If the number of transitions is, for example, 2 (as shown in FIG. 8), then the output of PROM 800 will be 00010, respectively on lines L1-L5. Four of the 5 bits are inverted by inverters $I_1$-$I_3$, $I_5$ i.e., those on lines $L_1$, $L_2$, $L_3$ and $L_5$. Thus, for a two transition count, the inputs to AND Gate 80 will all be ONE's and the Transition bit output is also a ONE or a HIGH. Any other number of transitions results in the transition bit being LOW.

VIII. Special Case Circuits (FIGS. 9-11)

There are three special case circuits, as shown in FIGS. 9-11. The circuit of FIG. 9 is used to produce a "HIGH" state or ONE bit, if only the Enable Ring is ON, meaning that only the Enable Ring has all pixels in the same state. In this case only, all five input bits to NOR Gate 90 stored in Latches 26 from Priority Encoder 24 will be ZERO's producing a ONE output from OR Gate 90, which is coupled to NOR Gate 43 (See FIG. 1). In any other case, at least one line will have a ONE bit, producing a ZERO output from NOR Gate 90.

In a similar manner, the circuit of FIG. 10 tests for pinholes or flecks of copper, depending upon the Enable bit state; a condition established if the SS-Ring binary number from Latches 26 is 00001 for SS-Ring #1. One of each of the 5 bits of this binary number is coupled to the five respective lines shown in FIG. 10, with the first bit $\phi$ being inverted by inverter $I_{10}$. These lines are coupled to NOR Gate 92 which produces a ONE output only in the single condition when the SS-Ring number is 1.

When no SS-Ring is enabled, the 5-digit binary number 01101 for SS-Ring 22 is coupled to NOR Gate 94 after the first, second and fourth bit of the φ-4 bits have been inverted in respective inverters $I_{11}$, $I_{12}$ and $I_{13}$, thus producing a ONE output for this one condition only. This condition indicates that the feature size is too large to be analyzed by the sensor circuitry.

IX. Feature Processor 44

As may be seen in FIG. 1, the Feature Processor 44 accepts the information from V-Ring Processor 56, Transition Processor 58, Centering Processor 38, the State bit from Latch 16 and the Quit bit from Latch 42, and the binary number corresponding to the V-Ring values stored in Table III of RAM 1. The Processor 44 processes this data in a series of logical tests, as will be shown in connection with the flow charts of FIG. 14 and 15.

Figure 14:
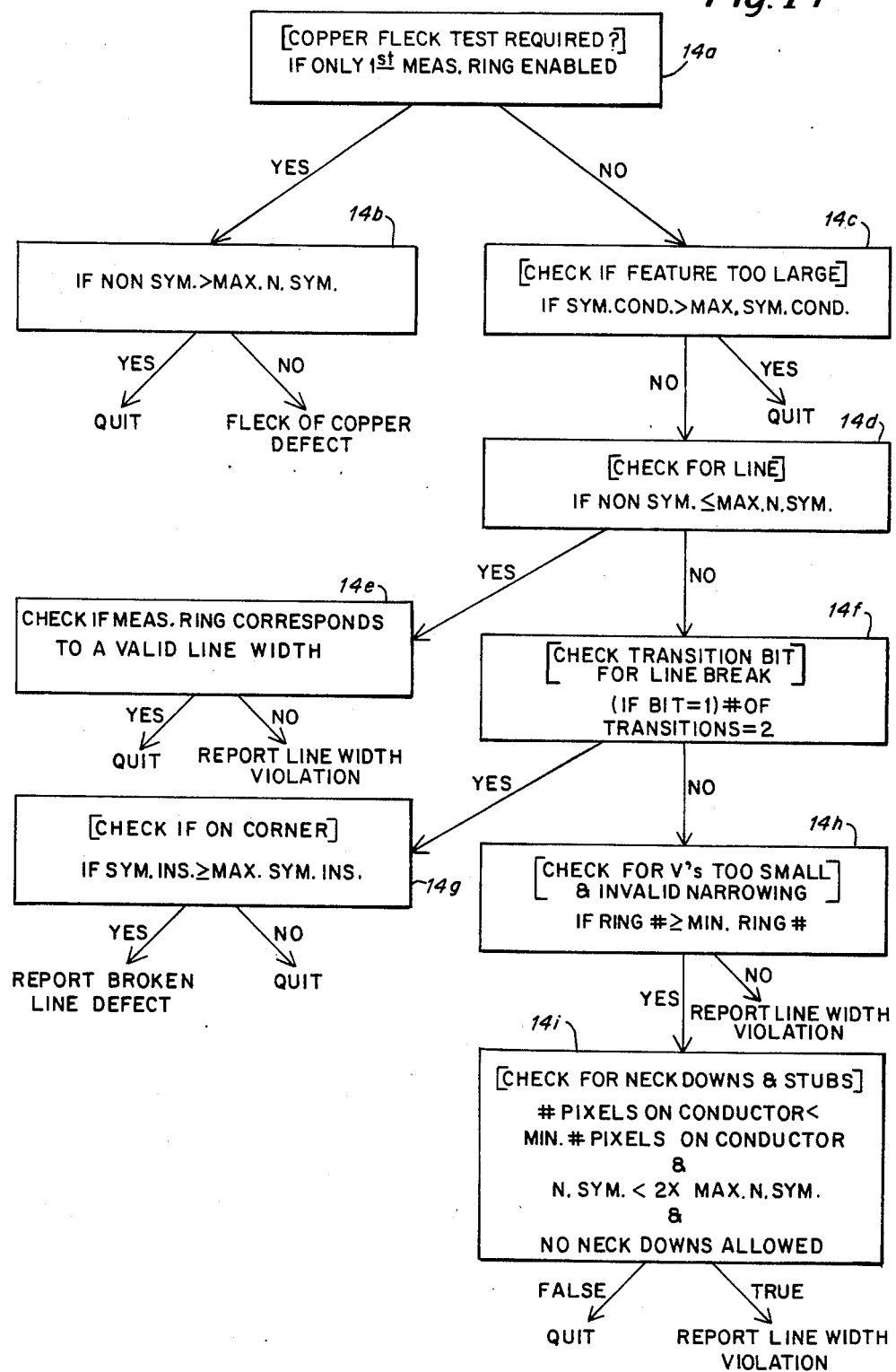
FIG. 14 is a flow chart of the program steps taken for feature verification when the feature is a conductor.
Figure 15:
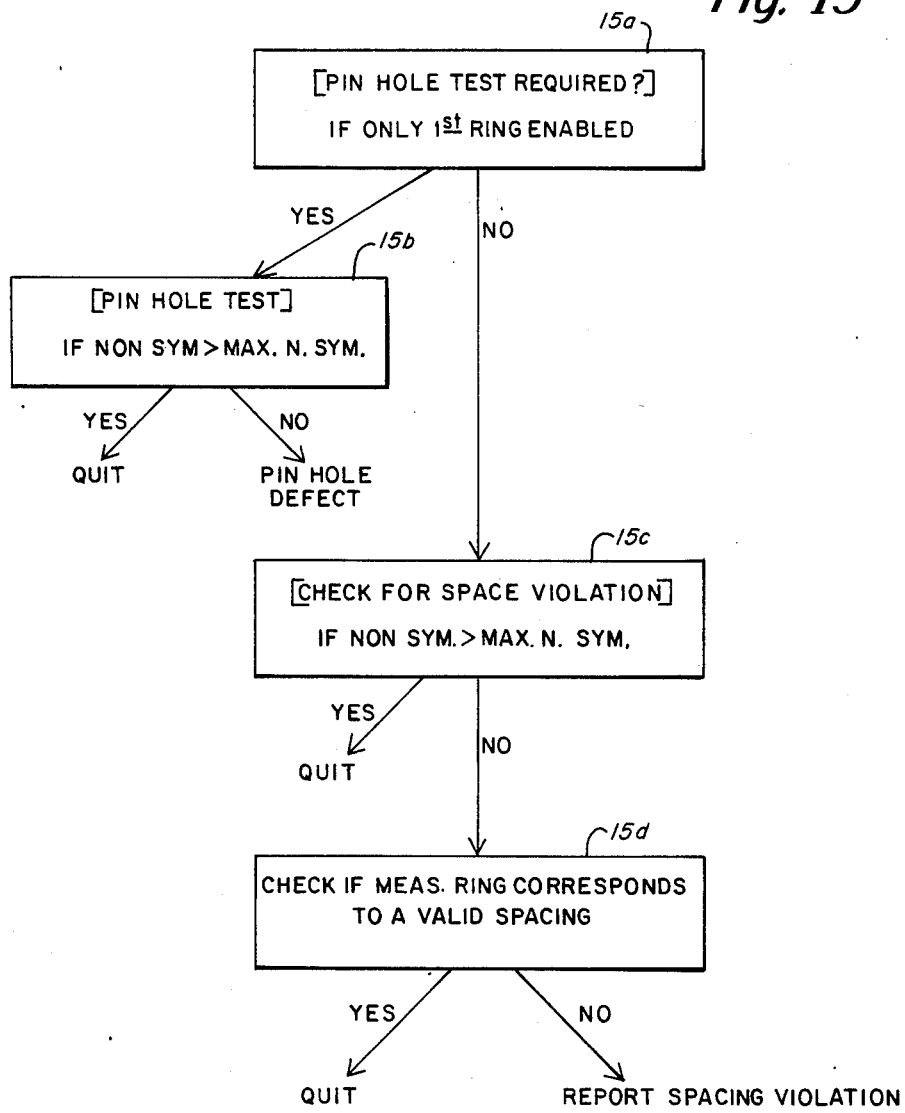
FIG. 15 is a flow chart of the program steps taken for feature verification when the feature is an insulator.

Depending upon whether the Enable bit signifies a conductor or an insulator feature, the respective set of tests shown in FIG. 14 or FIG. 15 will be performed by Processor 44. Note also that the tests are not conducted if a Quit bit is present from Latch 42, which is a Quit bit encompassing all previous Quit bits from the first two cycles.

Test 1, as shown in FIG. 14a, is a test to determine if a feature under inspection is in reality a fleck of copper. The sensor is programmed to indicate a fleck of copper defect if only the first SS-Ring is Enabled and the number of non-symmetric pixels is less than or equal to a predetermined maximum number. This means that a fleck of copper is assumed to be about 2 mils in diameter, i.e., the size of the first SS-Ring.

If only the SS-Ring is enabled (YES), as determined by the FIG. 10 circuit, then the Feature Processor 56 determines if the number of non-symmetrical pairs calculated in V-Ring Processor 56 exceeds the maximum non-symmetric pairs allocated by the Look-Up Table III stored in the RAM 1 of RAM circuit 30 for the selected V-Ring. If the calculated number of non-sympairs exceeds the predetermined value stored in RAM 1, a YES decision is made, resulting in a Quit bit because there is no other possible defect. If the number is equal to or less than the stored value, a NO decision is made, resulting in a defect enable signal from Processor Output Terminal 441, signifying a fleck of copper defect. The predetermined stored number is shown in Table III, Column 3.

If the first measurement ring is not the only ring enabled, then a check is made (Step 14c) to determine if the feature is too large, by comparing (a) the calculated symmetrical condition of the selected V-Ring versus (b) the maximum allowable symmetrical condition from the RAM 1 of RAM circuit 30. If (a) is greater than (b), then a Quit bit is generated to cease further processing. If (a) is not greater than (b), step 14d is performed by processor 44 to determine if the feature is a line.

In this step 14d, the (a) sensed number of non-symmetric pixels on the selected V-Ring is compared with the maximum non-symmetric values for that V-Ring, as stored in RAM 1 of RAM circuit 30. If (a) is less than or equal to (b), a YES decision is made indicating that the feature could be a valid line. If (a) is not less than or equal to (b), a NO decision is made and step 14(f) is performed to determine if a line break exists. In this test, the state of the transitions bit from transition processor 58 is checked to see if only two transitions occurred, indicating a line break. The transition bit is high (ONE) for two transitions indicating a possible line break and low (ZERO) for all other transition counts.

Step 14(e) is used to determine if the selected measurement ring data corresponds to the valid line width data stored in RAM 1. If it does not, a line width violation is reported on line 443. (FIG. 1)

In step 14(g); if two transitions were reported in step 14(f), YES, a further check is made to determine if the matrix window is centered on a corner. In this case, the calculated symmetrical insulator pixel number is compared to the stored maximum symmetrical insulator pixel number to determine if (a) the calculated number is greater than or equal to the stored number or (b) less than the stored number. If a YES decision is made as to (a) a broken line defect is reported on line 442 (FIG. 1). If a NO decision is made as to (a), a Quit bit is reported.

If the number of transitions is not equal to two in step 14(f), a further step 14(h) is warranted to check for Vees, i.e., invalid narrowing of circuit features. In step 14(h), the selected measurement ring number is compared to the minimum ring number size predetermined and stored in RAM 1. If it is not greater than or equal to the stored value, a line width violation is reported on line 443 (FIG. 1). If the minimum ring number size criterion is met, step 14(i) is performed to check for neck-downs and stubs. This is a three-fold condition test wherein:

(a) the calculated number of pixels on a conductor must be less than a preset minimum number stored in RAM 1; and
(b) the calculated number of non-symmetric pixels must be less than twice the stored maximum number of symmetric pairs; and
(c) no neck-downs are allowed.

If all of these conditions are met, (TRUE) a line width violation is reported on line 443 (FIG. 1). If any one condition is not met (FALSE) a Quit bit is sent.

XI. Insulator Test (FIG. 15)

FIG. 15 shows the tests performed on insulative features. A decision is made in Step 15a to see if a pinhole test should be performed. If only SS-Ring 1 is Enabled (YES), then Step 15b is performed to check for pinholes.

In Step 15b, the non-symmetric value calculated in V-Ring Processor 56 is compared with the maximum non-symmetric number stored in RAM 1. If greater (YES), a Quit bit is sent on line 445 (FIG. 1). If less (NO), a pinhole defect bit is sent out line 445.

If the test in 15a results in a NO decision, Step 15c is performed, instead of Step 15b. In Step 15c, spacing violations are checked by comparing (a) the value of the calculated number of non-symmetric pixels in the V-Ring with (b) the stored maximum number of non-symmetric pixels. If (a) is greater than or equal to (b), a YES decision is made and a Quit bit is sent out. If (a) is less than or equal to (b), a NO decision is made and the processor proceeds to Step 15d.

In Step 15d, a test is made to determine if (a) the size of the calculated Measurement Ring corresponds to (b) a valid spacing size stored in Table III of RAM 1. If (a) does not correspond with (b), a space size violation is reported on buss 444.

If (a) does correspond with (b), a Quit bit is sent.

Equivalents

This completes the description of the preferred embodiment of the invention. Those skilled in the art will be able to devise equivalent devices based upon the preferred embodiment set forth herein. Accordingly, this invention is not meant to be limited except as expressly stated in the following claims.

We claim:

1. Apparatus for inspecting and determining the presence of defects in features of patterned images of lines and spaces of predetermined acceptable line width and spacing sizes comprising:
   (a) an array of detectors for forming a pixel window consisting of a plurality of pixel bits of one of two possible opposite states generated by a characteristic of the image viewed by said detectors;
   (b) matrix apparatus for forming said pixels in a matrix of bits available for selection;
   (c) a first pattern of pixel bits selected from said matrix forming an enable pattern for determining if the feature viewed generates a first state bit signal or an opposite state bit signal;
   (d) a set of second patterns of pixel bits selected from said matrix forming progressively larger patterns about the center of the window for determining an edge of the feature by examining the state of all pixel bits in said set of second patterns until a pattern is found in which all pixel bits are not in the same state;
   (e) a set of third patterns selected from said matrix forming a series of verification patterns, one such verification pattern in the series being selected depending upon which one of the second patterns was the first second pattern in which all pixel bits were not in the same state;
   (f) logic means for determining the nature of the feature by examining the selected verification pattern to count the number of certain predetermined pixel bits of the verification pattern.

2. The apparatus of claim 1 further including centering means for determining if the feature is centered in the window by selecting one of said second patterns to form a centering pattern and determining if a pair of pixel bits on opposite sides of said centering pattern is in a state opposite to the state of the enable pattern.

3. The apparatus of claim 1 in which the dimensions of one of the verification patterns are compared with previously stored dimensional data for an acceptable image pattern to determine if the imaged pattern is defective.

4. The apparatus of claim 1 wherein the verification pattern comprises the smallest diameter pattern within which a square will fit, which square is centered on the center of the last pattern in said second set of patterns wherein all pixels are in the same state, said square having a width equal to the diameter of said last pattern.

5. Apparatus for inspecting and determining the presence of defects in features of patterned images of lines and spaces of predetermined acceptable line width and spacing sizes comprising:
   (a) an array of detectors for forming a pixel window consisting of a plurality of pixel bits of one of two opposite states generated by a characteristic of the image viewed by said detectors;
   (b) matrix apparatus for forming said pixels in a matrix of bits available for selection;
   (c) first logic means for selecting a first pattern of pixel bits from said matrix to form an enable pattern for determining if the feature viewed generates a first state bit signal or an opposite state bit signal;
   (d) second logic means for selecting a set of second patterns of pixel bits from said matrix forming progressively larger patterns about the center of the window for determining an edge of the feature and for examining the state of all pixel bits in said set of second patterns until a pattern is found in which all pixel bits are not in the same state;
   (e) third logic means for selecting a set of third patterns from said matrix to form a series of verification patterns, and for selecting one such verification pattern in the series depending upon which of the second patterns was the first second pattern in which all pixel bits were not in the same state;
   (f) fourth logic means for determining the nature of the feature by examining the selected verification pattern to count certain predetermined pixel bits of the verification pattern.

6. The apparatus of claim 5 further including centering means for determining if the feature is centered in the window by selecting one of said second patterns to form a centering pattern and determining if a pair of pixel bits on opposite sides of said centering pattern is in a state opposite to the state of the enable pattern.

7. The apparatus of claim 5, including means for comparing the dimensions of the verification pattern with previously stored dimensional data for an acceptable image pattern to determine if the imaged pattern is defective.

8. The apparatus of claim 5 wherein the predetermined pixel bits counted comprise all pairs of pixel bits on opposite sides of the selected verification pattern, and the number of such pixel pairs which are not symmetrical in the same state, the number of symmetric pairs in one state and the number of symmetric pairs in an opposite state are counted and a digital number signal corresponding to each such count is produced.

9. The apparatus of claim 5 including means for counting each pixel bit on the selected verification pattern which is in a first state and generating a digital number signal corresponding to such count and a Quit bit signal when such number exceeds a predetermined value.

10. The apparatus of claim 5 including means for counting the number of transitions in pixel states which occur on the selected verification pattern going from one pixel to an adjacent pixel and a transition bit of one state generated if the count is 2 and of an opposite state if the count is any other number.

11. The apparatus of claim 7 in which the stored data comprises the maximum number of symmetric pixels pairs in one state, the maximum number of symmetric pixel pairs in an opposite state, the maximum number of non-symmetric pixel pairs, the minimum number of pixels in one state, and the number of transitions in pixel state going from one pixel to a next adjacent pixel.

12. The apparatus of claim 11 wherein the opposite states are a first state if the image is a conductor feature and a second state if the image is an insulator feature and including a feature processor means for determining the following:
   (a) whether the feature is a small piece of conductor defect or a small pinhole defect, if the feature is too large in width, if the dimensions of the feature correspond to valid stored dimensions, if the number of transitions in pixel states which occur in the pixel pattern going from one pixel to a next adjacent pixel is only two and if so, whether the matrix number is centered on a corner.

13. The apparatus of claim 11 further including determining means for determining whether the feature narrows down in width.

14. The apparatus of claim 13 wherein the determining means includes means for determining if the following conditions obtain:
 (a) the number of pixels imaging a conductor are less than a prestored value, and
 (b) if the number of non-symmetric pixels are less than twice the stored value of maximum number of symmetric pixel pairs and
 (c) if no neck-downs are allowed; and
 (d) signalling means for signalling a line width violation if the three conditions a, b and c are met.

15. The apparatus of claim 12 wherein one set of determinations is made if the imaged feature is a conductor and another set of determinations is made if the feature is an insulator.

16. A method of inspecting and determining the presence of defects in features of patterned images of lines and spaces of predetermined acceptable line width and spacing sizes comprising the steps of:
 (a) arranging an array of optical detectors to form a pixel window consisting of a plurality of pixel bits of one of two opposite states generated by a characteristic of the image viewed by said detectors;
 (b) forming said pixels in a matrix of bits being available for selection;
 (c) selecting a first pattern of pixel bits from said matrix to form an enable pattern to determine if the feature viewed generates a first state bit signal or an opposite state bit signal;
 (d) selecting a set of second patterns of pixel bits from said matrix to form patterns about the center of the window to determine an edge of the feature by successively examining the state of all pixel bits in said second patterns until a second pattern is found in which all pixel bits are not in the same state;
 (e) selecting a set of third patterns from said matrix to form verification patterns;
 (f) selecting one of such verifications depending upon which of the second set of patterns was the second pattern in which all pixel bits were not in the same state; and
 (g) determining the nature of the feature by examining the selected verification pattern to count predetermined pixel bits of the verification pattern.

17. The method of claim 16 further including the step of determining if the feature is centered in the window by selecting one of said second patterns to form a centering pattern and determining if an opposite pair of pixel bits in said centering pattern is in a state opposite to the state of the enable pattern.

18. The method of claim 16 further including the step of comparing the dimensions of the verification pattern with stored dimensional data for an acceptable image pattern to determine if the imaged pattern is defective.

* * * * *